(12) United States Patent
Ko et al.

(10) Patent No.: US 8,304,296 B2
(45) Date of Patent: Nov. 6, 2012

(54) SEMICONDUCTOR PACKAGING SYSTEM WITH MULTIPART CONDUCTIVE PILLARS AND METHOD OF MANUFACTURE THEREOF

(75) Inventors: ChanHoon Ko, Incheon (KR); Junwoo Myung, Ichon-si (KR); Wonil Kwon, Song Pa Gu (KR)

(73) Assignee: STATS ChipPAC Ltd., Singapore (SG)

( * ) Notice: Subject to any disclaimer, the term of this patent is extended or adjusted under 35 U.S.C. 154(b) by 234 days.

(21) Appl. No.: 12/821,404

(22) Filed: Jun. 23, 2010

(65) Prior Publication Data
US 2011/0316155 A1    Dec. 29, 2011

(51) Int. Cl.
*H01L 21/44*    (2006.01)
*H01L 21/48*    (2006.01)
*H01L 21/50*    (2006.01)

(52) U.S. Cl. ........................ 438/124; 257/738
(58) Field of Classification Search .................. 257/738, 257/E21.502, E23.064; 438/124
See application file for complete search history.

(56) References Cited

U.S. PATENT DOCUMENTS

| 5,222,014 | A | 6/1993 | Lin |
| 6,987,314 | B1 | 1/2006 | Yoshida et al. |
| 7,608,921 | B2 * | 10/2009 | Pendse ........................ 257/686 |
| 2008/0017968 | A1 | 1/2008 | Choi et al. |
| 2009/0140408 | A1 | 6/2009 | Lee et al. |
| 2010/0089983 | A1 * | 4/2010 | MacKay et al. .............. 228/256 |

* cited by examiner

*Primary Examiner* — Phuc Dang
(74) *Attorney, Agent, or Firm* — Ishimaru & Associates LLP; Mikio Ishimaru; Stanley M. Chang

(57) ABSTRACT

A method of manufacture of a semiconductor packaging system includes: providing a substrate; mounting a semiconductor chip to the substrate; mounting a pillar ball having a ball height electrically connected to the substrate; mounting an interposer above the semiconductor chip and electrically connected to the pillar ball; and wherein: mounting the interposer or mounting the substrate includes connecting the pillar ball to a pillar base having a base height substantially less than the ball height of the pillar ball and the pillar base having vertical sides not covered by the pillar ball.

20 Claims, 7 Drawing Sheets

SEMICONDUCTOR PACKAGING SYSTEM WITH MULTIPART CONDUCTIVE PILLARS AND METHOD OF MANUFACTURE THEREOF

TECHNICAL FIELD

The present invention relates generally to a semiconductor packaging system and more particularly to a system for utilizing a multipart conductive pillar in a semiconductor packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of a semiconductor packaging system including: providing a substrate; mounting a semiconductor chip to the substrate; mounting a pillar ball having a ball height electrically connected to the substrate; mounting an interposer above the semiconductor chip and electrically connected to the pillar ball; and wherein: mounting the interposer or mounting the substrate includes connecting the pillar ball to a pillar base having a base height substantially less than the ball height of the pillar ball and the pillar base having vertical sides not covered by the pillar ball.

The present invention provides a semiconductor packaging system, including: a substrate; a semiconductor chip mounted to the substrate; a pillar ball having a ball height electrically connected to the substrate; an interposer above the semiconductor chip and electrically connected to the pillar ball; and a pillar base having a base height electrically connected to the pillar ball mounted between the pillar ball and the substrate or between the pillar ball and the interposer, and the base height of the pillar base is substantially less than the ball height of the pillar ball and the pillar base having vertical sides not covered by the pillar ball.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
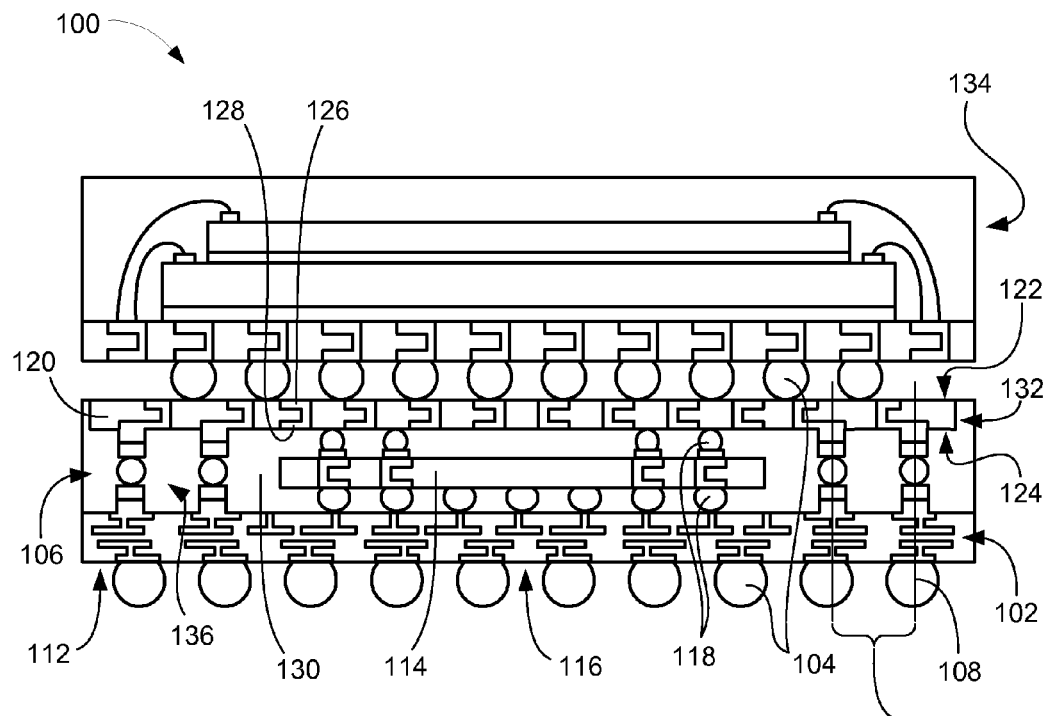
FIG. 1 is a cross-sectional view of a semiconductor packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a semiconductor packaging system 100 in an embodiment of the present invention. The semiconductor packaging system 100 is shown having a substrate 102 such as a laminated plastic or ceramic substrate 102.

Mounted below the substrate 102 are external interconnects 104 such as solder balls for system level integration. Mounted above the substrate 102 are multipart conductive pillars 106. The multipart conductive pillars 106 have centerlines 108 running vertically along the center of the multipart conductive pillars 106.

The multipart conductive pillars 106 also have a pitch 110. Pitch is defined herein as the distance between the centerlines 108 of the multipart conductive pillars 106. The multipart conductive pillars 106 are mounted along a perimeter 112 of the substrate 102 and surround a semiconductor chip such as a through silicon via die 114 that is mounted over a center 116 of the substrate 102.

The through silicon via die 114 is electrically connected to the substrate 102 with interconnects 118 such as solder ball interconnects. Mounted above the through silicon via die 114 is an interposer 120 and is electrically connected to the through silicon via die 114 with the interconnects 118. The interposer 120 is shown having two functional sides, such as a first functional side 122 and a second functional side 124, which allow for electrical signals to be routed between exposed conductors, such as exposed conductor 126, exposed from the first functional side 122, and exposed conductor 128, exposed from the second functional side 124.

The interposer 120 is typically a UV stabilized woven glass and epoxy resin with etched copper conductive pathways. Encapsulating the through silicon via die 114 and the multipart conductive pillars 106 is an encapsulation 130 such as film assisted molding, and helps protect sensitive components from moisture, dust and other contamination.

The multipart conductive pillars 106 are further shown extending through a portion of the encapsulation 130. The encapsulation 130 encapsulates vertical side portions 132 of the interposer 120. The encapsulation 130 entirely covers the vertical side portions 132 of the interposer 120. Mounted above the interposer 120 is an external package 134. The external package 134 is electrically connected to the exposed conductors 126, exposed from the first functional side 122 of the interposer 120 with the external interconnects 104.

Figure 2:
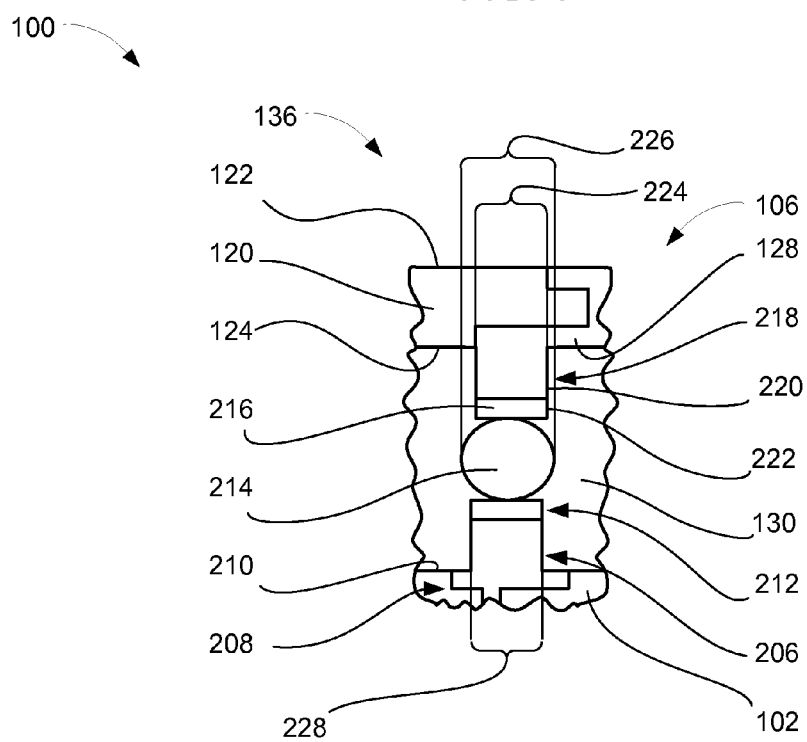
FIG. 2 is a magnified region of the semiconductor packaging system of FIG. 1.

Referring now to FIG. 2, therein is shown a magnified region 136 of the semiconductor packaging system 100 of FIG. 1. The semiconductor packaging system 100 is shown having the multipart conductive pillar 106 in greater detail and mounted above the substrate 102.

The multipart conductive pillar 106 is shown as composed of a first pillar base 206 in direct contact with the substrate 102 and contacting a substrate conductor 208. The first pillar base 206 is attached to the substrate conductor 208 flush to a top surface 210 of the substrate 102. The first pillar base 206 may be copper, gold, or other conductive materials.

Attached above the first pillar base 206 the multipart conductive pillar 106 includes a first pillar paste 212. The first pillar paste 212 may be a solder paste and is used to connect a pillar ball 214 above the first pillar base 206. The pillar ball 214 may be solder or electrically conductive polymer. The pillar ball 214 generally resembles a ball but the present invention does not require that the pillar ball 214 be spherical or even substantially spherical.

Attached above the pillar ball 214 the multipart conductive pillar 106 is shown having a second pillar paste 216 substantially similar to the first pillar paste 212. The second pillar paste 216 is attached below a second pillar base 218. The second pillar base 218 is substantially similar to the first pillar base 206 but is instead is in direct contact with the exposed conductor 128, exposed from the second functional side 124 of the interposer 120.

The encapsulation 130 is shown formed in a single encapsulation 130 that encapsulates vertical sides 220 of the first pillar base 206 and the second pillar base 218, and encapsulates vertical sides 222 of the first pillar paste 212 and the second pillar paste 216. The encapsulation 130 is further shown in direct contact with the top surface 210 of the substrate 102 and in direct contact with the second functional side 124 of the interposer 120.

It has been discovered that the combination of the pillar ball 214, the first pillar base 206, and the second pillar base 218 produce a very fine pitch 110 (of FIG. 1) reducing overall semiconductor packaging system size while allowing for a simple yet effective electrical connection between the interposer 120 and the substrate 102.

The multipart conductive pillar 106 is shown with the second pillar base 218 having a width 224 substantially similar to or smaller than a width 226 of the pillar ball 214. Similarly, the width 224 of the second pillar base 218 is substantially similar to a width 228 of the first pillar base 206.

Figure 3:
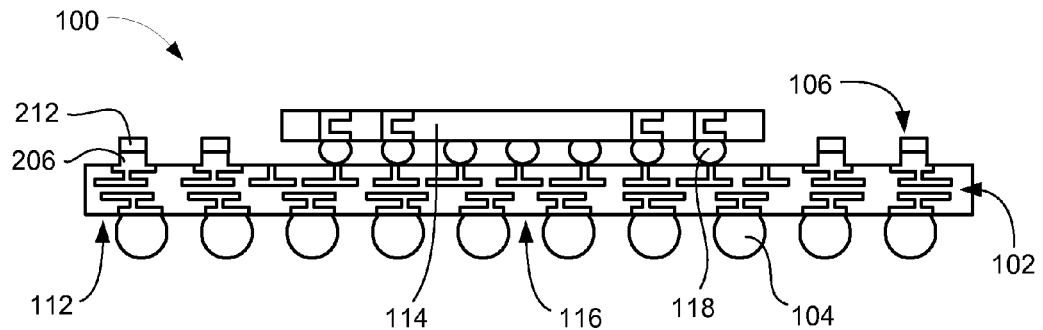
FIG. 3 is the semiconductor packaging system of FIG. 2 after a chip attach phase of manufacture.

Referring now to FIG. 3, therein is shown the semiconductor packaging system 100 of FIG. 2 after a chip attach phase of manufacture. The semiconductor packaging system 100 is shown having the through silicon via die 114 mounted over the substrate 102 and attached thereto with the interconnects 118.

The through silicon via die 114 is shown mounted over the center 116 of the substrate 102 and with the multipart conductive pillars 106 having the pillar base 206 and the pillar paste 212 formed near the perimeter 112 of the substrate 102. Below the substrate 102 the external interconnects 104 are mounted.

Figure 4:
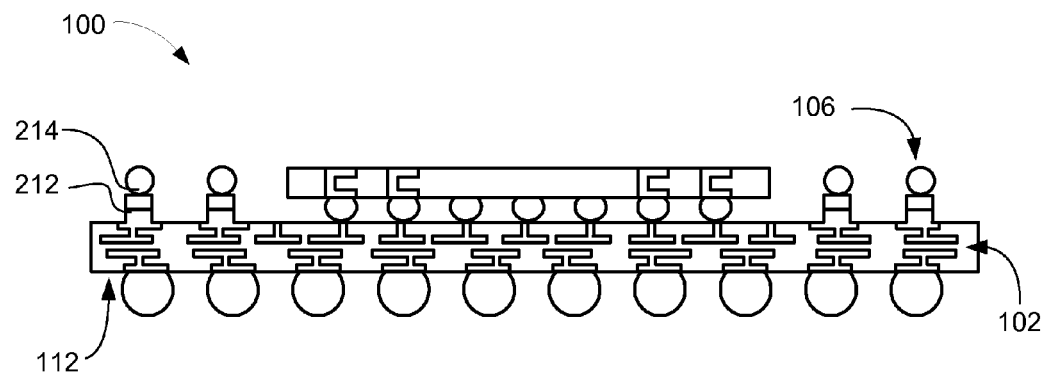
FIG. 4 is the semiconductor packaging system of FIG. 3 after a ball attach phase of manufacture.

Referring now to FIG. 4, therein is shown the semiconductor packaging system 100 of FIG. 3 after a ball attach phase of manufacture. The semiconductor packaging system 100 is shown having the pillar balls 214 deposited above the pillar paste 212 of the multipart conductive pillars 106 along the perimeter 112 of the substrate 102.

Figure 5:
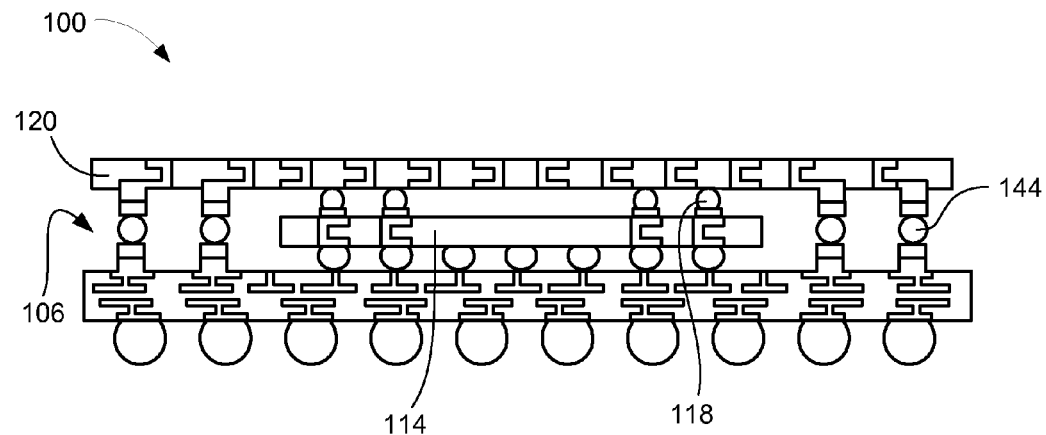
FIG. 5 is the semiconductor packaging system of FIG. 4 after an interposer attach phase of manufacture.

Referring now to FIG. 5, therein is shown the semiconductor packaging system 100 of FIG. 4 after an interposer attach phase of manufacture. The semiconductor packaging system 100 is shown having the interposer 120 mounted above the through silicon via die 114 and attached thereto with the interconnects 118. The interposer 120 is shown extending laterally above the pillar balls 214 of the multipart conductive pillars 106.

Figure 6:
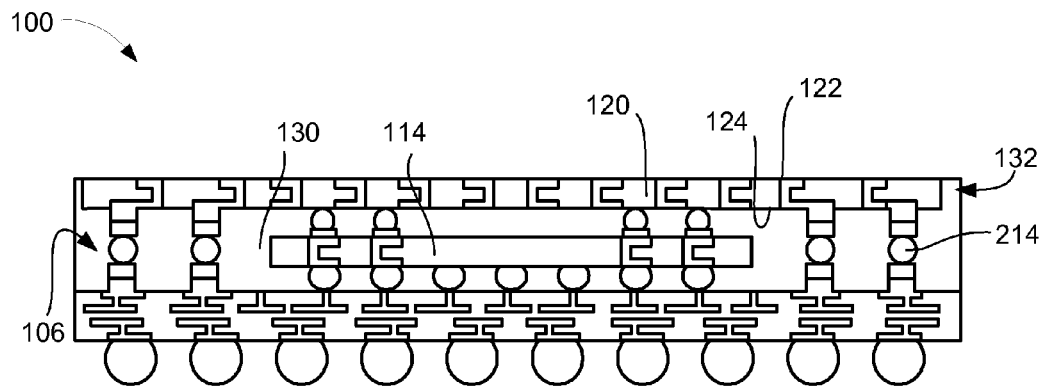
FIG. 6 is the semiconductor packaging system of FIG. 5 after a molding phase of manufacture.

Referring now to FIG. 6, therein is shown the semiconductor packaging system 100 of FIG. 5 after a molding phase of manufacture. The semiconductor packaging system 100 is shown having the encapsulation 130 encapsulating the through silicon via die 114 and the pillar balls 214 of the multipart conductive pillars 106.

The encapsulation 130 is further shown encapsulating the second functional side 124 and the vertical side portions 132 of the interposer 120 but does not encapsulate the first functional side 122 of the interposer 120.

Figure 7:
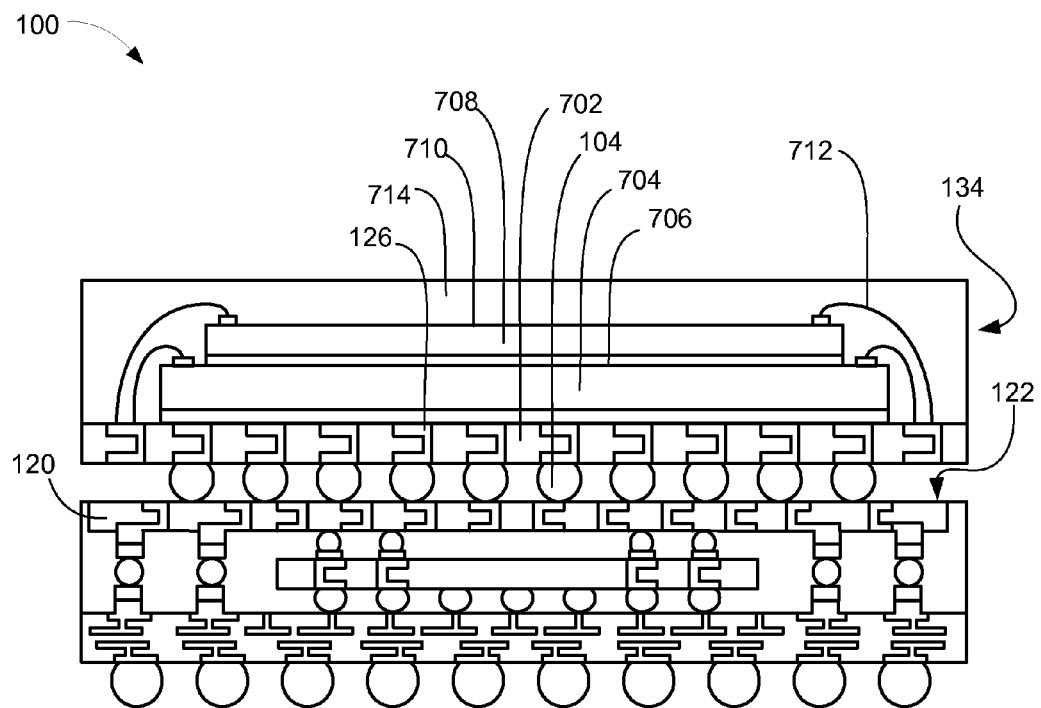
FIG. 7 is the semiconductor packaging system of FIG. 6 after an external mounting phase of manufacture.

Referring now to FIG. 7, therein is shown the semiconductor packaging system 100 of FIG. 6 after an external mounting phase of manufacture. The semiconductor packaging system 100 is shown having the external package 134 electrically connected to the exposed conductors 126, exposed from the first functional side 122 of the interposer 120 with the external interconnects 104.

The external package 134 is shown having an external package substrate 702. Mounted above the external package substrate 702 is a first external package integrated circuit 704 with an active side 706 facing away from the external package substrate 702. Mounted above the first external package integrated circuit 704 is a second external package integrated circuit 708 with an active side 710 facing away from the first external package integrated circuit 704.

The active side 710 of the second external package integrated circuit 708 and the active side 706 of the first external package integrated circuit 704 are electrically connected to the external package substrate 702 with external package interconnects 712 such as bond wires. Encapsulating the first external package integrated circuit 704 and the second external package integrated circuit 708 is an external package encapsulation 714.

Figure 8:
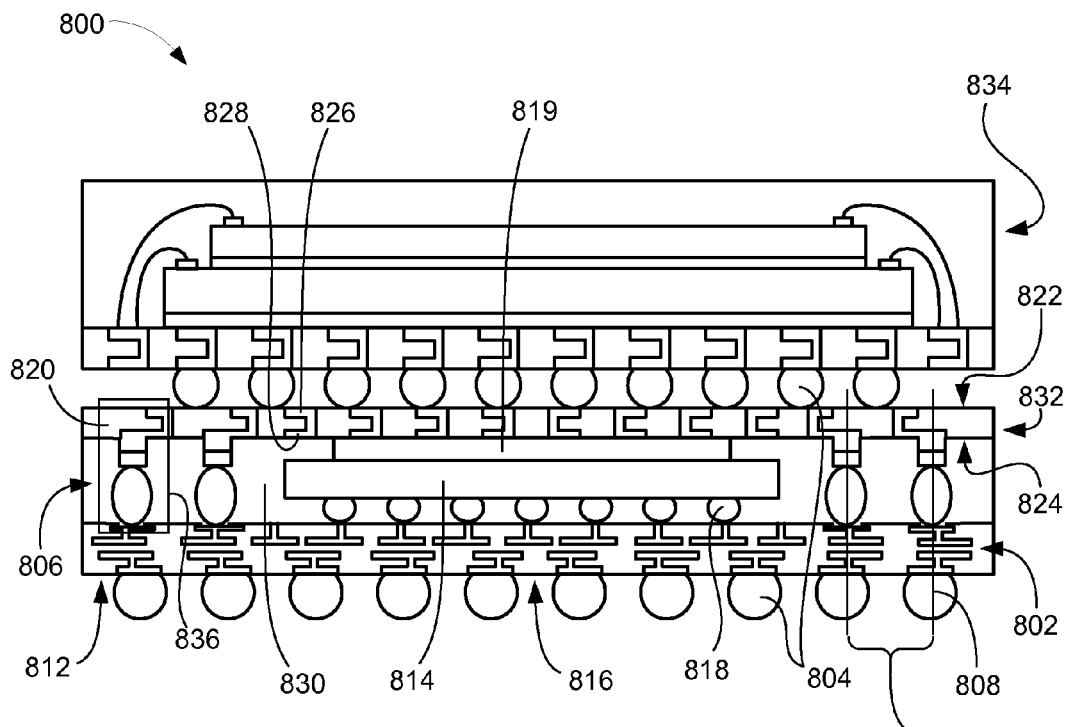
FIG. 8 is a cross-sectional view of a semiconductor packaging system in an embodiment of the present invention.

Referring now to FIG. 8, therein is shown a cross-sectional view of a semiconductor packaging system 800 in an embodiment of the present invention. The semiconductor packaging system 800 is shown having a substrate 802 such as a laminated plastic or ceramic substrate 802.

Mounted below the substrate 802 are external interconnects 804 such as solder balls for system level integration. Mounted above the substrate 802 are multipart conductive pillars 806. The multipart conductive pillars 806 have centerlines 808 running vertically along the center of the multipart conductive pillars 806.

The multipart conductive pillars 806 also have a pitch 810. Pitch is defined herein as the distance between the centerlines 808 of the multipart conductive pillars 806. The multipart conductive pillars 806 are mounted along a perimeter 812 of the substrate 802 and surround a semiconductor chip such as a flip-chip 814 that is mounted over a center 816 of the substrate 802.

The flip-chip 814 is electrically connected to the substrate 802 with interconnects 818 such as solder ball interconnects. Mounted above the flip-chip 814 is an interposer 820 and is attached to the flip-chip 814 with a die attach adhesive 819. The interposer 820 is shown having two functional sides, such as a first functional side 822 and a second functional side 824, which allow for electrical signals to be routed between exposed conductors, such as exposed conductor 826, exposed from the first functional side 822, and exposed conductor 828, exposed from the second functional side 824.

The interposer 820 is typically a UV stabilized woven glass and epoxy resin with etched copper conductive pathways. Encapsulating the flip-chip 814 and the multipart conductive pillars 806 is an encapsulation 830 such as film assisted molding, and helps protect sensitive components from moisture, dust and other contamination.

The multipart conductive pillars 806 are further shown extending through a portion of the encapsulation 830. The encapsulation 830 does not encapsulate side portions 832 of the interposer 820, instead the side portions 832 of the interposer 820 remain exposed from the encapsulation 830. Mounted above the interposer 820 is an external package 834. The external package 834 is electrically connected to the exposed conductors 826, exposed from the first functional side 822 of the interposer 820 with the external interconnects 804.

Figure 9:
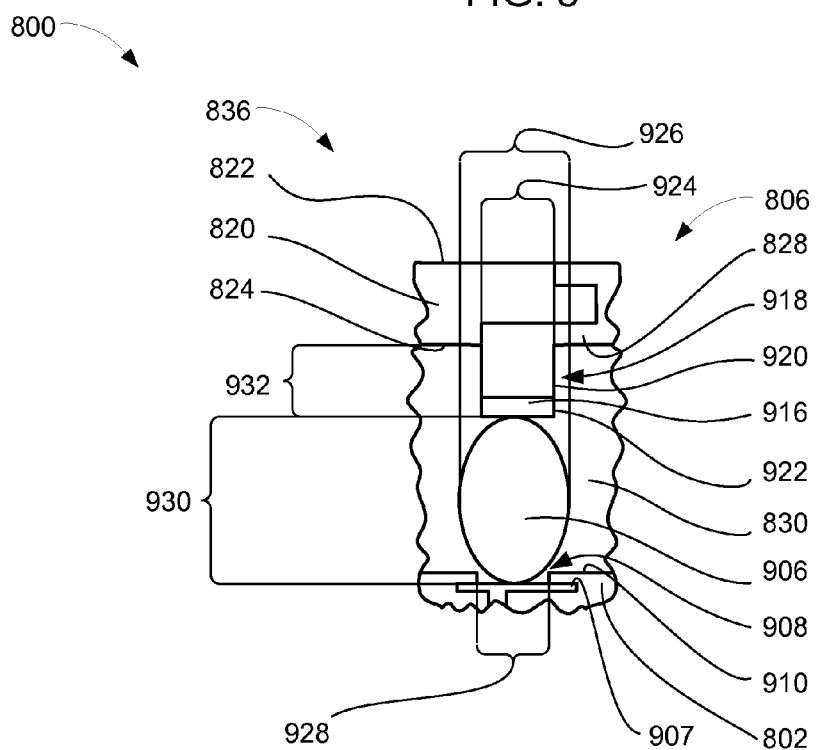
FIG. 9 is a magnified region of the semiconductor packaging system of FIG. 8.

Referring now to FIG. 9, therein is shown a magnified region 836 of the semiconductor packaging system 800 of FIG. 8. The semiconductor packaging system 800 is shown having the multipart conductive pillar 806 in greater detail and mounted above the substrate 802.

The multipart conductive pillar 806 is shown as composed of a pillar ball 906 in direct contact with the substrate 802 and contacting a substrate conductor 907. The pillar ball 906 is attached to the substrate 802 within a recess 908 below a top surface 910 of the substrate 802.

The pillar ball 906 may be solder or electrically conductive polymer. The pillar ball 906 is not depicted as substantially spherical.

Attached above the pillar ball 906 the multipart conductive pillar 806 is shown having a pillar paste 916. The pillar paste 916 is attached below a pillar base 918. The pillar base 918 is in direct contact with the exposed conductor 828, exposed from the second functional side 824 of the interposer 820.

The encapsulation 830 is shown formed in a single encapsulation 830 that encapsulates vertical sides 920 of the pillar base 918, and encapsulates vertical sides 922 of the pillar paste 916. The encapsulation 830 is further shown in direct contact with the top surface 910 of the substrate 802 and in direct contact with the second functional side 824 of the interposer 820. The encapsulation is also shown filling part of the recess 908 that is not filled by the pillar ball 906.

It has been discovered that the combination of the pillar ball 906 and the pillar base 918 produce a very fine pitch 810 (of FIG. 8) reducing overall semiconductor packaging system size while allowing for a simple yet effective electrical connection between the interposer 820 and the substrate 802.

The multipart conductive pillar 806 is shown with the pillar base 918 having a width 924 substantially smaller than a width 926 of the pillar ball 906. Similarly, the width 926 of the pillar ball 906 is substantially larger than a width 928 of the recess 908.

The multipart conductive pillar 806 is shown having the pillar ball 906 having a ball height 930. The ball height 930 of the pillar ball 906 is substantially 200 µm from the substrate conductor 907, within the recess 908 and below the top surface 910 of the substrate 802, to the pillar paste 916.

The multipart conductive pillar 806 is further shown with a combined height 932 of the pillar base 918 and the pillar paste 916. The combined height 932 of the pillar base 918 and the pillar paste 916 is substantially 50 µm which is substantially less than the ball height 930 of the pillar ball 906.

To ensure the highest density and fine pitch of the present invention, it is critical that the combined height 932 should be substantially 50 µm. This ensures that the ball height 930 is substantially 200 µm and is small enough to maintain a very fine pitch and the width 926 of the pillar ball 906 does not become prohibitively large requiring more material and increasing package footprint. It is also critical for the present invention that the combined height 932 should be smaller than the ball height 930 to ensure faster and less expensive process flow.

Figure 10:
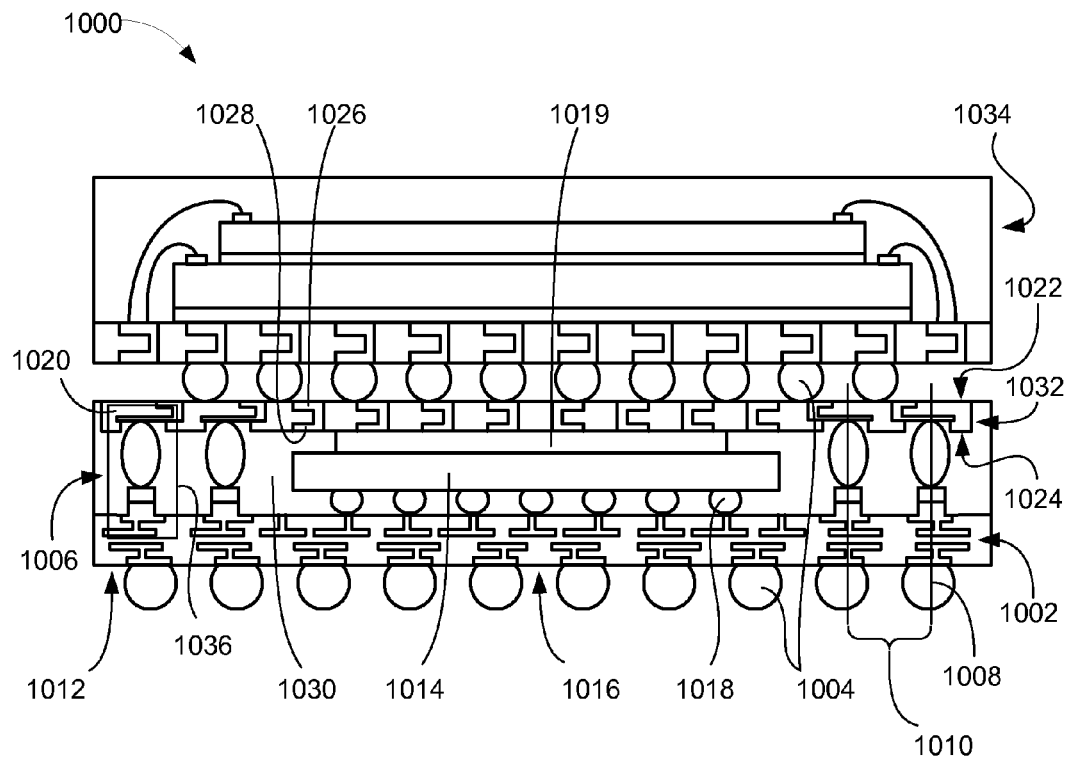
FIG. 10 is a cross-sectional view of a semiconductor packaging system in an embodiment of the present invention.

Referring now to FIG. 10, therein is shown a cross-sectional view of a semiconductor packaging system 1000 in an embodiment of the present invention. The semiconductor packaging system 1000 is shown having a substrate 1002 such as a laminated plastic or ceramic substrate 1002.

Mounted below the substrate 1002 are external interconnects 1004 such as solder balls for system level integration. Mounted above the substrate 1002 are multipart conductive pillars 1006. The multipart conductive pillars 1006 have centerlines 1008 running vertically along the center of the multipart conductive pillars 1006.

The multipart conductive pillars 1006 also have a pitch 1010. Pitch is defined herein as the distance between the centerlines 1008 of the multipart conductive pillars 1006. The multipart conductive pillars 1006 are mounted along a perimeter 1012 of the substrate 1002 and surround a semiconductor chip such as a flip-chip 1014 that is mounted over a center 1016 of the substrate 1002.

The flip-chip 1014 is electrically connected to the substrate 1002 with interconnects 1018 such as solder ball interconnects. Mounted above the flip-chip 1014 is an interposer 1020 and is attached to the flip-chip 1014 with a die attach adhesive 1019. The interposer 1020 is shown having two functional sides, such as a first functional side 1022 and a second functional side 1024, which allow for electrical signals to be routed between exposed conductors, such as exposed conductor 1026, exposed from the first functional side 1022, and exposed conductor 1028, exposed from the second functional side 1024.

The interposer 1020 is typically a UV stabilized woven glass and epoxy resin with etched copper conductive pathways. Encapsulating the flip-chip 1014 and the multipart conductive pillars 1006 is an encapsulation 1030 such as film assisted molding, and helps protect sensitive components from moisture, dust and other contamination.

The multipart conductive pillars 1006 are further shown extending through a portion of the encapsulation 1030. The encapsulation 1030 encapsulates side portions 1032 of the interposer 1020. Mounted above the interposer 1020 is an external package 1034. The external package 1034 is electrically connected to the exposed conductors 1026, exposed from the first functional side 1022 of the interposer 1020 with the external interconnects 1004.

Figure 11:
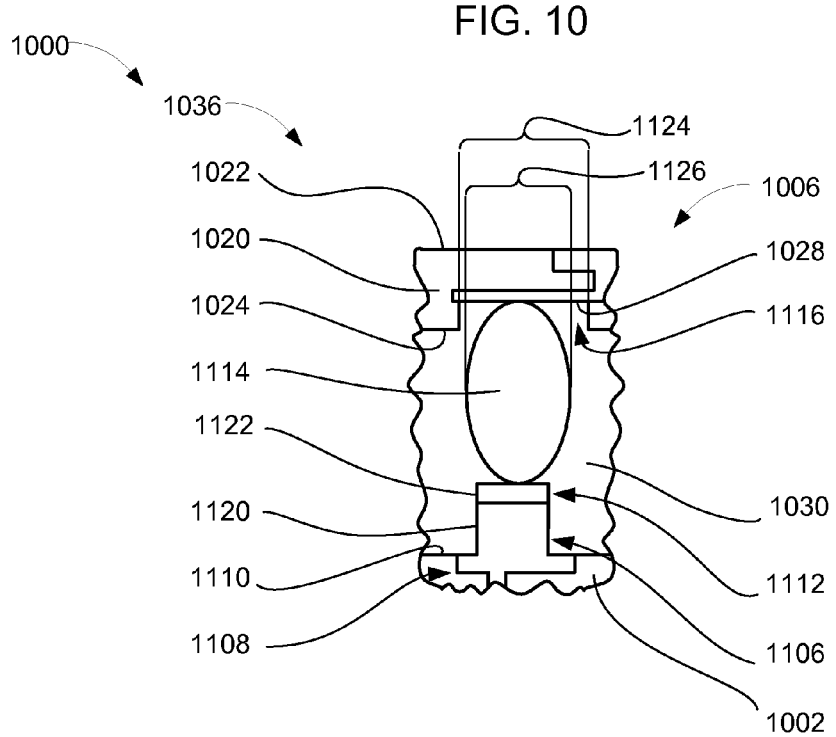
FIG. 11 is a magnified region of the semiconductor packaging system of FIG. 10.

Referring now to FIG. 11, therein is shown a magnified region 1036 of the semiconductor packaging system 1000 of FIG. 10. The semiconductor packaging system 1000 is shown having the multipart conductive pillar 1006 in greater detail and mounted above the substrate 1002.

The multipart conductive pillar 1006 is shown as composed of a pillar base 1106 in direct contact with the substrate 1002 and contacting a substrate conductor 1108. The pillar base 1106 is attached to the substrate conductor 1108 flush to a top surface 1110 of the substrate 1002. The pillar base 1106 may be copper, gold, or other conductive materials.

Attached above the pillar base 1106 the multipart conductive pillar 1006 includes a pillar paste 1112. The pillar paste 1112 may be a solder paste and is used to connect a pillar ball 1114 above the pillar base 1106. The pillar ball 1114 may be solder or electrically conductive polymer. The pillar ball 1114 is not depicted as substantially spherical.

The pillar ball 1114 is in direct contact with the interposer 1020 and contacting the exposed conductor 1028 exposed from the second functional side 1024 of the interposer 1024. The pillar ball 1114 is attached to the interposer 1020 within a recess 1116 below the second functional side 1024 of the interposer 1020.

The encapsulation 1030 is shown formed in a single encapsulation 1030 that encapsulates vertical sides 1120 of the pillar base 1106 and encapsulates vertical sides 1122 of the pillar paste 1112. The encapsulation 1030 is further shown in direct contact with the top surface 1110 of the substrate 1002 and in direct contact with the second functional side 1024 of the interposer 1020.

It has been discovered that the combination of the pillar ball 1114 and the pillar base 1106 produce a very fine pitch 1010 (of FIG. 10) reducing overall semiconductor packaging system size while allowing for a simple yet effective electrical connection between the interposer 1020 and the substrate 1002. The multipart conductive pillar 1006 is shown with the recess 1116 having a width 1124 substantially larger than a width 1126 of the pillar ball 1114.

The pillar ball 1114 is shown as substantially taller than the pillar base 1106 extending through substantially more encapsulation 1030 than the pillar base 1106. Finally, the encapsulation 1030 is shown filling part of the recess 1116 in the interposer 1020 that is not filled by the pillar ball 1114.

Figure 12:
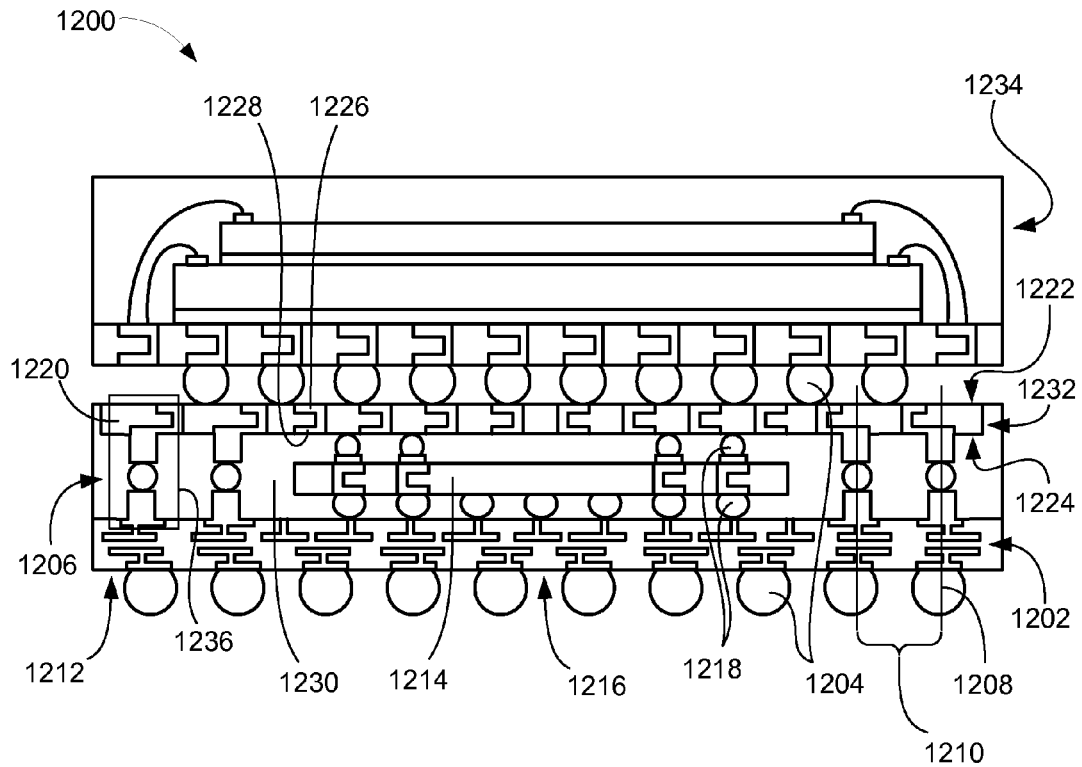
FIG. 12 is a cross-sectional view of a semiconductor packaging system in an embodiment of the present invention.

Referring now to FIG. 12, therein is shown a cross-sectional view of a semiconductor packaging system 1200 in an embodiment of the present invention. The semiconductor packaging system 1200 is shown having a substrate 1202 such as a laminated plastic or ceramic substrate 1202.

Mounted below the substrate 1202 are external interconnects 1204 such as solder balls for system level integration.

Mounted above the substrate 1202 are multipart conductive pillars 1206. The multipart conductive pillars 1206 have centerlines 1208 running vertically along the center of the multipart conductive pillars 1206.

The multipart conductive pillars 1206 also have a pitch 1210. Pitch is defined herein as the distance between the centerlines 1208 of the multipart conductive pillars 1206. The multipart conductive pillars 1206 are mounted along a perimeter 1212 of the substrate 1202 and surround a semiconductor chip such as a through silicon via die 1214 that is mounted over a center 1216 of the substrate 1202.

The through silicon via die 1214 is electrically connected to the substrate 1202 with interconnects 1218 such as solder ball interconnects. Mounted above the through silicon via die 1214 is an interposer 1220 and is electrically connected to the through silicon via die 1214 with the interconnects 1218. The interposer 1220 is shown having two functional sides, such as a first functional side 1222 and a second functional side 1224, which allow for electrical signals to be routed between exposed conductors, such as exposed conductor 1226, exposed from the first functional side 1222, and exposed conductor 1228, exposed from the second functional side 1224.

The interposer 1220 is typically a UV stabilized woven glass and epoxy resin with etched copper conductive pathways. Encapsulating the through silicon via die 1214 and the multipart conductive pillars 1206 is an encapsulation 1230 such as film assisted molding, and helps protect sensitive components from moisture, dust and other contamination.

The multipart conductive pillars 1206 are further shown extending through a portion of the encapsulation 1230. The encapsulation 1230 encapsulates side portions 1232 of the interposer 1220. Mounted above the interposer 1220 is an external package 1234. The external package 1234 is electrically connected to the exposed conductors 1226, exposed from the first functional side 1222 of the interposer 1220 with the external interconnects 1204.

Figure 13:
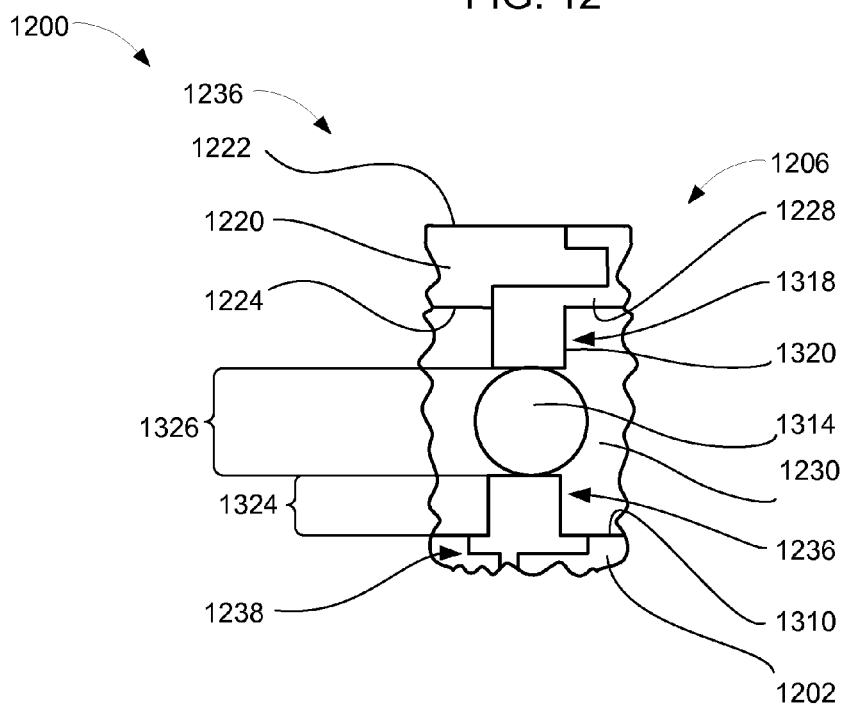
FIG. 13 is a magnified region of the semiconductor packaging system of FIG. 12.

Referring now to FIG. 13, therein is shown a magnified region 1236 of the semiconductor packaging system 1200 of FIG. 12. The semiconductor packaging system 1200 is shown having the multipart conductive pillar 1206 in greater detail and mounted above the substrate 1202.

The multipart conductive pillar 1206 is shown as composed of a first pillar base 1306 in direct contact with the substrate 1202 and contacting a substrate conductor 1308. The first pillar base 1306 is attached to the substrate conductor 1308 flush to a top surface 1310 of the substrate 1202. The first pillar base 1306 may be copper, gold, or other conductive materials.

Attached above the first pillar base 1306 the multipart conductive pillar 1206 includes a pillar ball 1314. The pillar ball 1314 may be solder or electrically conductive polymer. The pillar ball 1314 generally resembles a ball but the present invention does not require that the pillar ball 1314 be spherical or even substantially spherical.

Attached above the pillar ball 1314 the multipart conductive pillar 1206 is shown having a second pillar base 1318. The second pillar base 1318 is substantially similar to the first pillar base 1306 but is instead is in direct contact with the exposed conductor 1228, exposed from the second functional side 1224 of the interposer 1220.

The encapsulation 1230 is shown formed in a single encapsulation 1230 that encapsulates vertical sides 1320 of the first pillar base 1306. The encapsulation 1230 is further shown in direct contact with the top surface 1310 of the substrate 1202 and in direct contact with the second functional side 1224 of the interposer 1220.

It has been discovered that the combination of the pillar ball 1314, the first pillar base 1306, and the second pillar base 1318 produce a very fine pitch 1210 (of FIG. 12) reducing overall semiconductor packaging system size while allowing for a simple yet effective electrical connection between the interposer 1220 and the substrate 1202.

The multipart conductive pillar 1206 is shown with the first pillar base 1306 having a base height 1324 substantially smaller than a ball height 1326 of the pillar ball 1314. The base height 1324 of the first pillar base may 1306 be substantially 50 µm above the top surface 1310 of the substrate 1202. The ball height 1326 of the pillar ball 1314 may be substantially 150 µm extending between the first pillar base 1306 and the second pillar base 1318.

To ensure the highest density and fine pitch of the present invention, it is critical that the base height 1324 should be substantially 50 µm. This ensures that the ball height 1326 is substantially 150 µm and is small enough to maintain a very fine pitch and width of the pillar ball 1314 does not become prohibitively large requiring more material and increasing package footprint. It is also critical for the present invention that the base height 1324 should be smaller than the ball height 1326 to ensure faster and less expensive process flow.

Figure 14:
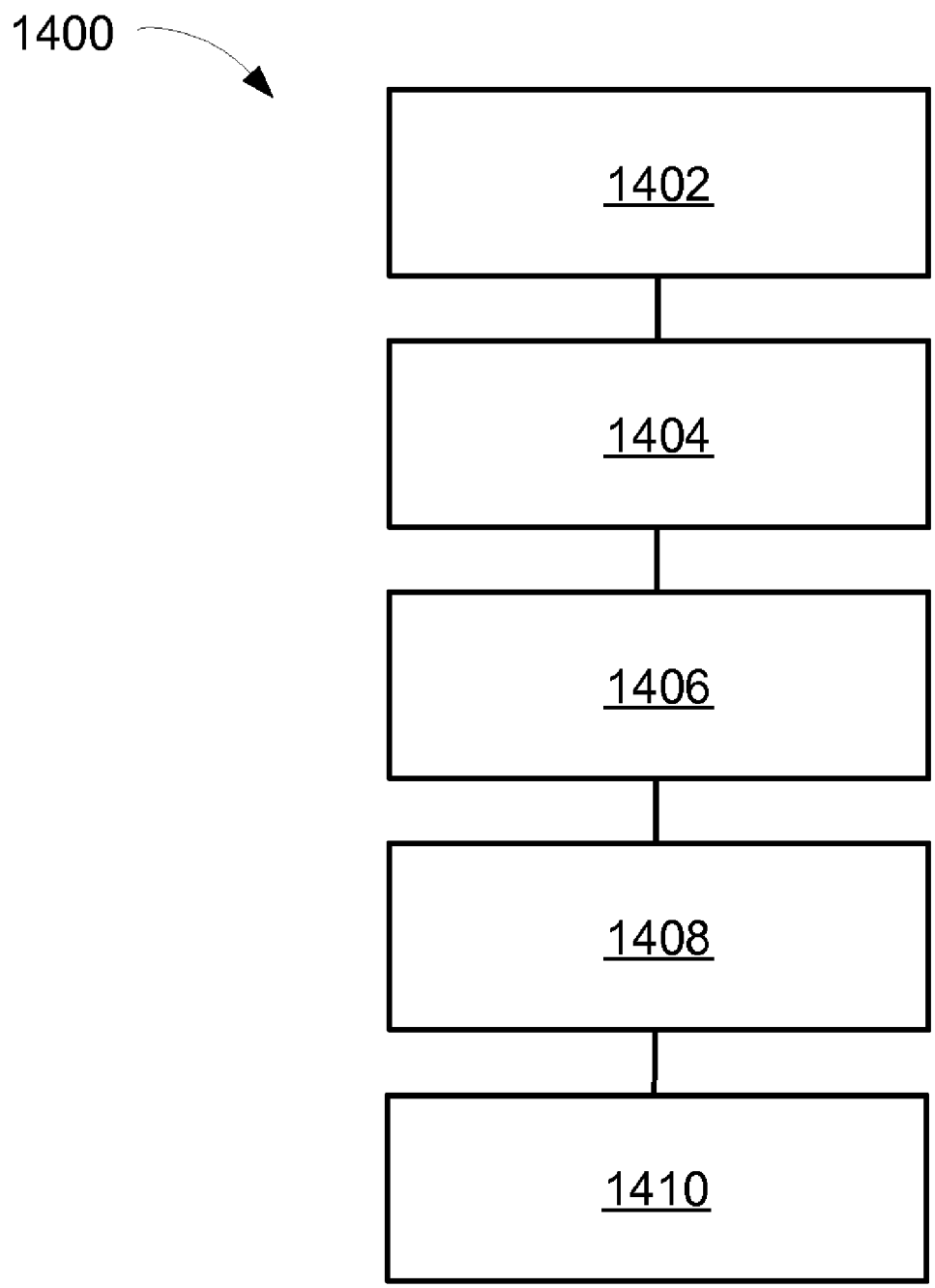
FIG. 14 is a flow chart of a method of manufacture of the semiconductor packaging system of FIG. 1.

Referring now to FIG. 14, therein is shown a flow chart of a method 1400 of manufacture of the semiconductor packaging system 140 of FIG. 1. The method 1400 includes providing a substrate in a block 1402; mounting a semiconductor chip to the substrate in a block 1404; mounting a pillar ball having a ball height electrically connected to the substrate in a block 1406; mounting an interposer above the semiconductor chip and electrically connected to the pillar ball in a block 1408; and wherein: mounting the interposer or mounting the substrate includes connecting the pillar ball to a pillar base having a base height substantially less than the ball height of the pillar ball in a block 1410.

Thus, it has been discovered that the multipart conductive pillar system of the present invention furnishes important and heretofore unknown and unavailable solutions, capabilities, and functional aspects for semiconductor packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor packaging system comprising:
   providing a substrate;
   mounting a semiconductor chip to the substrate;
   mounting a pillar ball, having a ball height, electrically connected to the substrate;
   mounting an interposer above the semiconductor chip and electrically connected to the pillar ball;
   forming an encapsulation around the semiconductor chip and entirely covering a vertical side portion of the interposer; and wherein:
mounting the interposer or mounting the substrate includes connecting the pillar ball to a pillar base having a base height substantially less than the ball height of the pillar ball and the pillar base having vertical sides not covered by the pillar ball.

2. The method as claimed in claim 1 wherein:
connecting the pillar ball to the pillar base includes mounting the pillar ball to a first pillar base between the pillar ball and the substrate; and
further comprising:
connecting the pillar ball to a second pillar base between the pillar ball and the interposer.

3. The method as claimed in claim 1 wherein:
mounting the pillar ball includes mounting the pillar ball in direct contact to the substrate and within a recess below a top surface of the substrate.

4. The method as claimed in claim 1 wherein:
connecting the pillar ball to the pillar base includes mounting the pillar ball to the pillar base with a pillar paste in between.

5. The method as claimed in claim 1 wherein:
mounting the semiconductor chip includes mounting a through silicon via die, a flip-chip, or a combination thereof.

6. A method of manufacture of a semiconductor packaging system comprising:
providing a substrate;
mounting a semiconductor chip to the substrate;
mounting a pillar ball, having a ball height, electrically connected to the substrate;
mounting an interposer above the semiconductor chip and electrically connected to the pillar ball;
encapsulating the semiconductor chip and the pillar ball with an encapsulation, the encapsulation entirely covering a vertical side portion of the interposer;
mounting an external package electrically connected to the interposer; and
wherein:
mounting the interposer or mounting the substrate includes connecting the pillar ball to a pillar base having a base height substantially less than the ball height of the pillar ball and the pillar base having vertical sides not covered by the pillar ball.

7. The method as claimed in claim 6 wherein:
mounting the pillar ball includes mounting the pillar ball having a ball height of substantially 200 µm and in direct contact to the substrate and within a recess below a top surface of the substrate.

8. The method as claimed in claim 6 wherein:
connecting the pillar ball to the pillar base includes connecting the pillar ball to the pillar base having a base height of substantially 50 µm or connecting the pillar ball to the pillar base and a pillar paste having a combined height of substantially 50 µm.

9. The method as claimed in claim 6 wherein:
connecting the pillar ball to the pillar base includes mounting the pillar ball to a first pillar base between the pillar ball and the substrate;
further comprising:
connecting the pillar ball to a second pillar base between the pillar ball and the interposer; and wherein:
mounting the pillar ball includes mounting the pillar ball having a ball height of substantially 150 µm between the first pillar base and the second pillar base.

10. The method as claimed in claim 6 wherein:
mounting the pillar ball includes mounting the pillar ball not substantially spherical.

11. A semiconductor packaging system comprising:
a substrate;
a semiconductor chip mounted to the substrate;
a pillar ball, having a ball height, electrically connected to the substrate;
an interposer above the semiconductor chip and electrically connected to the pillar ball;
an encapsulation around the semiconductor chip and entirely covering a vertical side portion of the interposer; and
a pillar base, having a base height, electrically connected to the pillar ball mounted between the pillar ball and the substrate or between the pillar ball and the interposer, the base height of the pillar base is substantially less than the ball height of the pillar ball and the pillar base having vertical sides not covered by the pillar ball.

12. The system as claimed in claim 11 wherein:
the pillar base is a first pillar base between the pillar ball and the substrate; and
further comprising:
a second pillar base between the pillar ball and the interposer.

13. The system as claimed in claim 11 wherein:
the pillar ball is in direct contact with the substrate and within a recess below a top surface of the substrate.

14. The system as claimed in claim 11 wherein:
the pillar ball is mounted to the pillar base with a pillar paste in between.

15. The system as claimed in claim 11 wherein:
the semiconductor chip is a through silicon via die, a flip-chip, or a combination thereof.

16. The system as claimed in claim 11 wherein:
the encapsulation encapsulates the semiconductor chip and the pillar ball; and
further comprising:
an external package electrically connected to the interposer.

17. The system as claimed in claim 16 wherein:
the pillar ball has a ball height of substantially 200 µm and is in direct contact with the substrate and within a recess below a top surface of the substrate.

18. The system as claimed in claim 16 wherein:
the pillar base has a base height of substantially 50 µm or the pillar base and a pillar paste has a combined height of substantially 50 µm.

19. The system as claimed in claim 16 wherein:
the pillar base is a first pillar base between the pillar ball and the substrate;
further comprising:
a second pillar base between the pillar ball and the interposer; and
wherein:
the pillar ball has a ball height of substantially 150 µm between the first pillar base and the second pillar base.

20. The system as claimed in claim 16 wherein:
the pillar ball is not substantially spherical.

* * * * *